United States Patent
Ji et al.

(10) Patent No.: US 10,615,827 B2
(45) Date of Patent: Apr. 7, 2020

(54) LOCAL OSCILLATOR FEEDTHROUGH SIGNAL CORRECTION APPARATUS AND METHOD, AND MICROPROCESSOR CONTROL UNIT

(71) Applicant: Huawei Technologies Co., Ltd., Shenzhen, Guangdong (CN)

(72) Inventors: Tengteng Ji, Xi'an (CN); Junpeng Wang, Xi'an (CN); Bin Ding, Xi'an (CN); Haiming Fan, Segrate (IT)

(73) Assignee: HUAWEI TECHNOLOGIES CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/976,655

(22) Filed: May 10, 2018

(65) Prior Publication Data

US 2018/0262221 A1 Sep. 13, 2018

Related U.S. Application Data

(63) Continuation of application No. PCT/CN2016/105350, filed on Nov. 10, 2016.

(30) Foreign Application Priority Data

Nov. 11, 2015 (CN) .......................... 2015 1 0769409

(51) Int. Cl.
*H04B 1/04* (2006.01)
*H04L 27/36* (2006.01)
(Continued)

(52) U.S. Cl.
CPC ............... *H04B 1/04* (2013.01); *H03D 7/165* (2013.01); *H04B 1/0475* (2013.01); *H04B 1/40* (2013.01);
(Continued)

(58) Field of Classification Search
CPC .......... H04B 1/04; H04B 1/16; H04B 1/0475; H04B 1/0458; H04B 2001/0433;
(Continued)

(56) References Cited

U.S. PATENT DOCUMENTS

| 7,259,716 B1 | 8/2007 | Dubbert et al. |
| 2004/0132424 A1 | 7/2004 | Aytur et al. |

(Continued)

FOREIGN PATENT DOCUMENTS

| CN | 101162910 A | 4/2008 |
| CN | 101540640 A | 9/2009 |

(Continued)

*Primary Examiner* — David C Payne
*Assistant Examiner* — Sarah Hassan
(74) *Attorney, Agent, or Firm* — Wombe Bond Dickinson (US) LLP

(57) ABSTRACT

The present disclosure discloses a local oscillator feedthrough signal correction apparatus, including a microprocessor control unit, a first digital-to-analog converter, a second digital-to-analog converter, a mixer, a local oscillator, a signal output line, a signal splitter, and a detector tube. The signal splitter is disposed in the signal output line, and the first digital-to-analog converter and the second digital-to-analog converter are configured to provide the mixer with quadrature direct current components VI and VQ used for local oscillator feedthrough signal correction. The mixer outputs a local oscillator feedthrough signal to the signal output line. The signal splitter obtains the local oscillator feedthrough signal by means of splitting, and the detector tube detects the local oscillator feedthrough signal. When a detection value of the local oscillator feedthrough signal exceeds a preset target value, the microprocessor control unit adjusts output values of the VI and the VQ to reduce local oscillator feedthrough.

6 Claims, 7 Drawing Sheets

(51) Int. Cl.
*H03D 7/16* (2006.01)
*H04B 17/13* (2015.01)
*H04L 27/00* (2006.01)
*H04B 1/40* (2015.01)
*H04L 25/06* (2006.01)
*H03F 3/19* (2006.01)
*H03F 3/24* (2006.01)

(52) U.S. Cl.
CPC ......... *H04B 17/13* (2015.01); *H04L 27/0014* (2013.01); *H04L 27/364* (2013.01); *H03D 2200/009* (2013.01); *H03F 3/19* (2013.01); *H03F 3/245* (2013.01); *H04B 2001/0491* (2013.01); *H04L 25/061* (2013.01); *H04L 2027/0016* (2013.01); *H04L 2027/0018* (2013.01); *H04L 2027/0053* (2013.01)

(58) Field of Classification Search
CPC ... H04B 1/40; H04B 1/44; H04B 1/18; H04B 1/0057; H04B 1/0064
USPC .......................................... 375/295; 370/316
See application file for complete search history.

(56) References Cited

U.S. PATENT DOCUMENTS

| | | | |
|---|---|---|---|
| 2007/0042728 A1* | 2/2007 | Pan | H04B 1/30 455/127.1 |
| 2014/0028372 A1 | 1/2014 | Cai et al. | |
| 2015/0270835 A1* | 9/2015 | Hati | H03K 5/1252 332/146 |

FOREIGN PATENT DOCUMENTS

| | | |
|---|---|---|
| CN | 102065041 A | 5/2011 |
| CN | 102270965 A | 12/2011 |
| CN | 102355438 A | 2/2012 |
| CN | 102510265 A | 6/2012 |
| CN | 104158552 A | 11/2014 |
| CN | 102915454 B | 9/2015 |
| CN | 105471468 A | 4/2016 |
| JP | H1141303 A | 2/1999 |
| WO | 2011/131229 A1 | 10/2011 |

* cited by examiner

101 — A microprocessor control unit reads, from a detector tube, a detection value that is of a local oscillator feedthrough signal and that is detected by the detector tube, where the microprocessor control unit is applied to a communication transmission system, and the communication transmission system further includes a first digital-to-analog converter, a second digital-to-analog converter, a mixer, a local oscillator, a signal output line, a signal splitter, and the detector tube, where the signal splitter is disposed in the signal output line, the microprocessor control unit is connected to the first digital-to-analog converter and the second digital-to-analog converter, the first digital-to-analog converter and the second digital-to-analog converter are separately connected to the mixer, the local oscillator is connected to the mixer, the mixer is connected to the signal output line, one end of the detector tube is connected to the signal splitter, and the other end of the detector tube is connected to the microprocessor control unit 102 — Compare the detection value with a preset local oscillator feedthrough target value 103 — When the detection value is greater than the target value, control and adjust quadrature direct current components VI and VQ that are output by the first digital-to-analog converter and the second digital-to-analog converter to the mixer and that are used for local oscillator feedthrough signal correction

FIG. 5

LOCAL OSCILLATOR FEEDTHROUGH SIGNAL CORRECTION APPARATUS AND METHOD, AND MICROPROCESSOR CONTROL UNIT

CROSS-REFERENCE TO RELATED APPLICATIONS

This application is a continuation of International Application No. PCT/CN2016/105350, filed on Nov. 10, 2016, which claims priority to Chinese Patent Application No. 201510769409.4, filed on Nov. 11, 2015. The disclosures of the aforementioned applications are hereby incorporated by reference in their entireties.

TECHNICAL FIELD

The present application relates to the field of communications technologies, and specifically, to a local oscillator feedthrough signal correction apparatus and method, and a microprocessor control unit.

BACKGROUND

In a communication transmission system, local oscillator feedthrough is a problem that needs to be highlighted. The local oscillator feedthrough is mainly caused by direct current components of two signals I/Q at an input end of a mixer. The local oscillator feedthrough worsens an error vector magnitude (EVM) of a desired signal, transmit power accuracy of a desired signal, spurious emission, linearity of a transmit link, and the like. Therefore, the local oscillator feedthrough needs to be processed.

In a typical application, a local oscillator filter is disposed at an output end of a mixer to filter out local oscillator feedthrough. However, in a microwave application, a filter for local oscillator feedthrough rejection is difficult to be implemented. In addition, for a direct up-conversion system, a local oscillator signal falls within a signal band, and cannot be filtered out by a filter.

SUMMARY

To resolve a prior-art problem of local oscillator signal feedthrough, embodiments of the present disclosure provide a local oscillator feedthrough signal correction apparatus, so that direct current components of quadrature signals I/Q at an input end of a mixer can be adjusted in real time, thereby reducing local oscillator feedthrough. The embodiments of the present disclosure further provide a corresponding local oscillator feedthrough signal correction method and a microprocessor control unit.

A first aspect of the present disclosure provides a local oscillator feedthrough signal correction apparatus, including a microprocessor control unit, a first digital-to-analog converter, a second digital-to-analog converter, a mixer, a local oscillator, a signal output line, a signal splitter, and a detector tube, where the signal splitter is disposed in the signal output line;

the microprocessor control unit is connected to the first digital-to-analog converter and the second digital-to-analog converter, the first digital-to-analog converter and the second digital-to-analog converter are separately connected to the mixer, and the first digital-to-analog converter and the second digital-to-analog converter are configured to provide the mixer with quadrature direct current components VI and VQ used for local oscillator feedthrough signal correction;

the local oscillator is connected to the mixer, and the local oscillator is configured to provide the mixer with a local oscillator signal;

the mixer is connected to the signal output line, and the mixer is configured to output a local oscillator feedthrough signal to the signal output line;

one end of the detector tube is connected to the signal splitter, and the other end of the detector tube is connected to the microprocessor control unit; the signal splitter is configured to obtain the local oscillator feedthrough signal by means of splitting, and the detector tube is configured to detect the local oscillator feedthrough signal; and the microprocessor control unit is configured to: when a detection value that is of the local oscillator feedthrough signal and that is detected by the detector tube exceeds a preset local oscillator feedthrough target value, control the first digital-to-analog converter and the second digital-to-analog converter to adjust output values of the VI and the VQ.

In the prior art, it is difficult to filter out a local oscillator feedthrough signal. By contrast, in the first aspect of the embodiments of the present disclosure, according to the local oscillator feedthrough signal correction apparatus provided in the embodiments of the present disclosure, a closed loop is established between the microprocessor control unit and the signal output line by using the signal splitter and the detector tube, so that direct current components of quadrature signals I/Q at an input end of the mixer can be adjusted in real time, thereby reducing local oscillator feedthrough.

With reference to the first aspect, in a first possible implementation, the apparatus further includes a local oscillator amplifier, where one end of the local oscillator amplifier is connected to the detector tube, and the other end of the local oscillator amplifier is connected to the signal splitter; the local oscillator amplifier is configured to amplify the local oscillator feedthrough signal obtained by the signal splitter by means of splitting.

In the first possible implementation, adding of the local oscillator amplifier can further amplify the local oscillator feedthrough signal, so that the detector tube can detect the local oscillator feedthrough signal more easily.

With reference to the first aspect or the first possible implementation of the first aspect, in a second possible implementation, the signal output line includes a drive amplifier, a power amplifier, a first connection cable, a second connection cable, and a third connection cable, where the first connection cable is configured to connect the drive amplifier and the mixer, the second connection cable is configured to connect the drive amplifier and the power amplifier, and the third connection cable is configured to connect the power amplifier and an output component; and the signal splitter is disposed on the first connection cable, the second connection cable, or the third connection cable.

With reference to the second possible implementation of the first aspect, in a third possible implementation, when the signal splitter is disposed on the first connection cable, the signal output line further includes a filter, and the filter is disposed between the signal splitter and the drive amplifier.

With reference to the second possible implementation of the first aspect, in a fourth possible implementation, when the signal splitter is disposed on the third connection cable, the power amplifier is in an enabled state in a receive timeslot.

With reference to the second possible implementation of the first aspect, in a fifth possible implementation, when the signal splitter is disposed on the first connection cable or the second connection cable, the microprocessor control unit is configured to: when determining that a current timeslot of a transmit link is a receive timeslot, read the detection value of the local oscillator feedthrough signal from the detector tube.

A second aspect of the present disclosure provides a local oscillator feedthrough signal correction method, where the method is applied to a communication transmission system, and the communication transmission system includes a microprocessor control unit, a first digital-to-analog converter, a second digital-to-analog converter, a mixer, a local oscillator, a signal output line, a signal splitter, and a detector tube, where the signal splitter is disposed in the signal output line, the microprocessor control unit is connected to the first digital-to-analog converter and the second digital-to-analog converter, the first digital-to-analog converter and the second digital-to-analog converter are separately connected to the mixer, the local oscillator is connected to the mixer, the mixer is connected to the signal output line, one end of the detector tube is connected to the signal splitter, and the other end of the detector tube is connected to the microprocessor control unit; the method includes:

reading, by the microprocessor control unit from the detector tube, a detection value that is of a local oscillator feedthrough signal and that is detected by the detector tube;

comparing, by the microprocessor control unit, the detection value with a preset local oscillator feedthrough target value; and when the detection value is greater than the target value, controlling and adjusting, by the microprocessor control unit, quadrature direct current components VI and VQ that are output by the first digital-to-analog converter and the second digital-to-analog converter to the mixer and that are used for local oscillator feedthrough signal correction.

In the prior art, it is difficult to filter out a local oscillator feedthrough signal. By contrast, in the second aspect of the embodiments of the present disclosure, according to the local oscillator feedthrough signal correction method provided in the embodiments of the present disclosure, direct current components of quadrature signals I/Q at an input end of the mixer can be adjusted in real time, thereby reducing local oscillator feedthrough.

With reference to the second aspect, in a first possible implementation, the signal output line includes a drive amplifier, a power amplifier, a first connection cable, and a second connection cable, the first connection cable is configured to connect the drive amplifier and the mixer, the second connection cable is configured to connect the drive amplifier and the power amplifier, and the signal splitter is disposed on the first connection cable or the second connection cable; and the reading, by the microprocessor control unit from the detector tube, a detection value that is of a local oscillator feedthrough signal and that is detected by the detector tube specifically includes:

before reading, from the detector tube, the detection value that is of the local oscillator feedthrough signal and that is detected by the detector tube, determining, by the microprocessor control unit, whether a current timeslot of a transmit link is a receive timeslot; and when the current timeslot is the receive timeslot, reading, by the microprocessor control unit from the detector tube, the detection value that is of the local oscillator feedthrough signal and that is detected by the detector tube.

In the first possible implementation of the second aspect, the local oscillator feedthrough signal is corrected in the receive timeslot, so that the signal splitter detects only the local oscillator feedthrough signal. In this way, a detection result is accurate, a correction effect is favorable, and a system service is not affected.

A third aspect of the present disclosure provides a microprocessor control unit, where the microprocessor control unit is applied to a communication transmission system, and the communication transmission system further includes a first digital-to-analog converter, a second digital-to-analog converter, a mixer, a local oscillator, a signal output line, a signal splitter, and a detector tube, where the signal splitter is disposed in the signal output line, the microprocessor control unit is connected to the first digital-to-analog converter and the second digital-to-analog converter, the first digital-to-analog converter and the second digital-to-analog converter are separately connected to the mixer, the local oscillator is connected to the mixer, the mixer is connected to the signal output line, one end of the detector tube is connected to the signal splitter, and the other end of the detector tube is connected to the microprocessor control unit; the microprocessor control unit includes:

a reading unit, configured to read, from the detector tube, a detection value that is of a local oscillator feedthrough signal and that is detected by the detector tube;

a comparison unit, configured to compare the detection value read by the reading unit with a preset local oscillator feedthrough target value; and a control and adjustment unit, configured to: when the comparison unit learns that the detection value is greater than the target value, control and adjust quadrature direct current components VI and VQ that are output by the first digital-to-analog converter and the second digital-to-analog converter to the mixer and that are used for local oscillator feedthrough signal correction.

In the prior art, it is difficult to filter out a local oscillator feedthrough signal. By contrast, in the third aspect of the embodiments of the present disclosure, according to the microprocessor control unit provided in the embodiments of the present disclosure, direct current components of quadrature signals I/Q at an input end of the mixer can be adjusted in real time, thereby reducing local oscillator feedthrough.

With reference to the third aspect, in a first possible implementation, the signal output line includes a drive amplifier, a power amplifier, a first connection cable, and a second connection cable, the first connection cable is configured to connect the drive amplifier and the mixer, the second connection cable is configured to connect the drive amplifier and the power amplifier, and the signal splitter is disposed on the first connection cable or the second connection cable; and the reading unit is specifically configured to:

before reading, from the detector tube, the detection value that is of the local oscillator feedthrough signal and that is detected by the detector tube, determine whether a current timeslot of a transmit link is a receive timeslot; and when the current timeslot is the receive timeslot, read, from the detector tube, the detection value that is of the local oscillator feedthrough signal and that is detected by the detector tube.

In the first possible implementation of the third aspect, the local oscillator feedthrough signal is corrected in the receive timeslot, so that the signal splitter detects only the local oscillator feedthrough signal. In this way, a detection result is accurate, a correction effect is favorable, and a system service is not affected.

BRIEF DESCRIPTION OF DRAWINGS

To describe the technical solutions in the embodiments of the present disclosure more clearly, the following briefly describes the accompanying drawings required for describing the embodiments. Apparently, the accompanying drawings in the following description show merely some embodiments of the present disclosure, and a person skilled in the art may still derive other drawings from these accompanying drawings without creative efforts.

FIG. 5 is a schematic diagram of an embodiment of a local oscillator feedthrough signal correction method according to the embodiments of the present disclosure;

DESCRIPTION OF EMBODIMENTS

Embodiments of the present disclosure provide a local oscillator feedthrough signal correction apparatus, so that direct current components of quadrature signals I/Q at an input end of a mixer can be adjusted in real time, thereby reducing local oscillator feedthrough. The embodiments of the present disclosure further provide a corresponding local oscillator feedthrough signal correction method and a microprocessor control unit. Details are separately described in the following.

The following clearly describes the technical solutions in the embodiments of the present disclosure with reference to the accompanying drawings in the embodiments of the present disclosure. Apparently, the described embodiments are merely some but not all of the embodiments of the present disclosure. All other embodiments obtained by a person skilled in the art based on the embodiments of the present disclosure without creative efforts shall fall within the protection scope of the present disclosure.

Considering that local oscillator feedthrough is mainly caused by direct current components of two quadrature signals I/Q at an input end of a mixer, the local oscillator feedthrough may be adjusted by adjusting the direct current components of the signals I/Q. This is a technical principle of local oscillator feedthrough signal correction.

Figure 1:
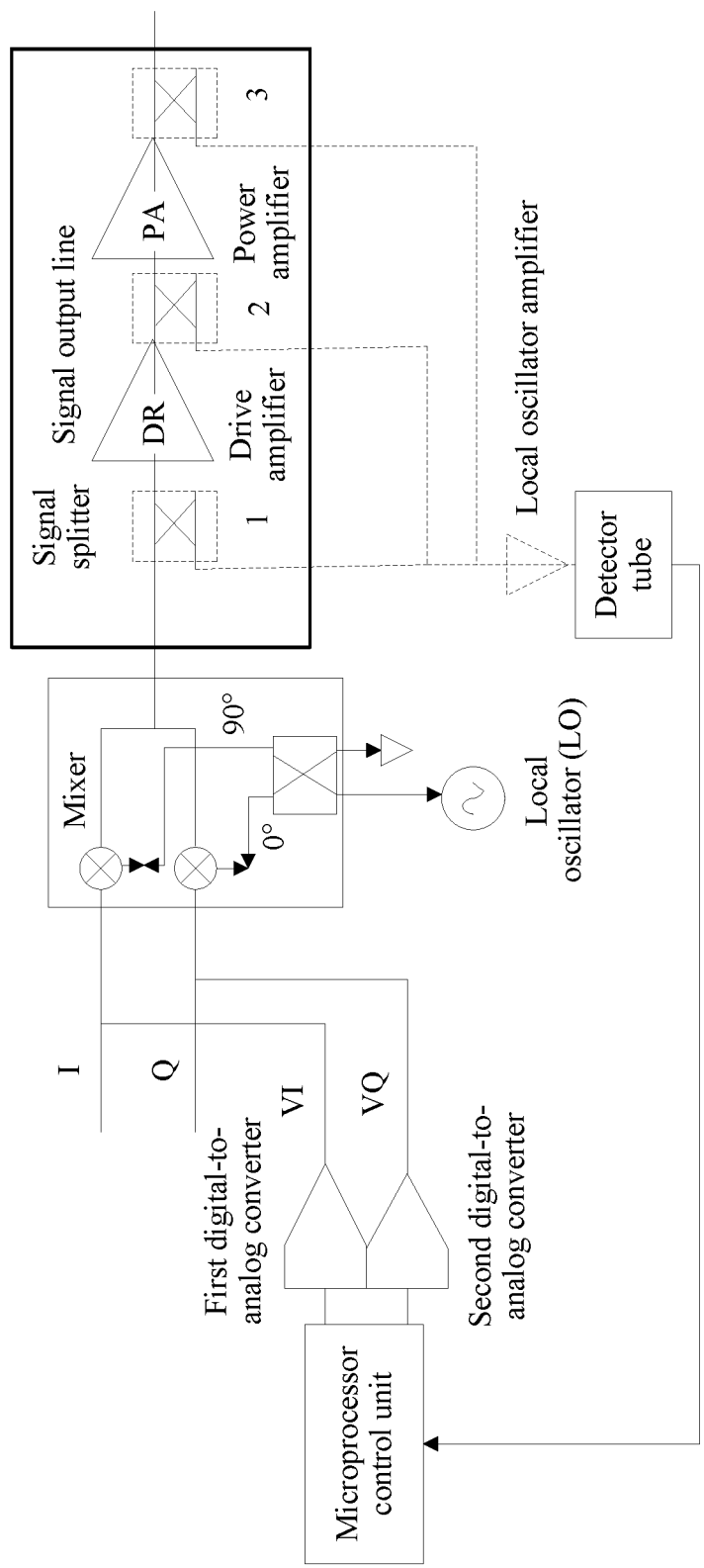
FIG. 1 is a schematic diagram of an embodiment of a local oscillator feedthrough signal correction apparatus according to the embodiments of the present disclosure.

FIG. 1 is a schematic diagram of an embodiment of a local oscillator feedthrough signal correction apparatus according to the embodiments of the present disclosure.

Referring to FIG. 1, the local oscillator feedthrough signal correction apparatus provided in this embodiment of the present disclosure includes:

a microprocessor control unit (MCU), a first digital-to-analog converter (DAC), a second digital-to-analog converter, a mixer, a local oscillator (LO), a signal output line, a signal splitter, and a detector tube, where the signal splitter is disposed in the signal output line.

The signal splitter may be a coupler or a power splitter. In this embodiment of the present disclosure, that the signal splitter is configured to obtain a local oscillator feedthrough signal by means of splitting is extracting the local oscillator feedthrough signal in a coupling manner by using the coupler, or extracting the local oscillator feedthrough signal by using the power splitter.

The signal output line includes a drive amplifier (DA), a power amplifier (PA), a first connection cable, a second connection cable, and a third connection cable. The first connection cable is configured to connect the drive amplifier and the mixer, the second connection cable is configured to connect the drive amplifier and the power amplifier, and the third connection cable is configured to connect the power amplifier and another output component (not shown in FIG. 1) succeeding the power amplifier.

The signal splitter is disposed on the first connection cable, the second connection cable, or the third connection cable. As shown in FIG. 1, the signal splitter may be disposed at a location 1, a location 2, or a location 3 shown in FIG. 1. Local oscillator correction in this embodiment of the present disclosure can be implemented by disposing the signal splitter at only one of the location 1, the location 2, or the location 3.

As shown in FIG. 1, the local oscillator feedthrough signal correction apparatus may further include a local oscillator amplifier. One end of the local oscillator amplifier is connected to the detector tube, and the other end of the local oscillator amplifier is connected to the signal splitter. The local oscillator amplifier is configured to amplify the local oscillator feedthrough signal obtained by the signal splitter by means of splitting. The local oscillator amplifier is optional. If the local oscillator amplifier is included, the local oscillator feedthrough signal is amplified, so that the detector tube can detect the local oscillator feedthrough signal more easily.

The microprocessor control unit is connected to the first digital-to-analog converter and the second digital-to-analog converter, the first digital-to-analog converter and the second digital-to-analog converter are separately connected to the mixer, and the first digital-to-analog converter and the second digital-to-analog converter are configured to provide the mixer with quadrature direct current components VI and VQ used for local oscillator feedthrough signal correction. For example, as shown in FIG. 1, the first digital-to-analog converter provides the quadrature direct current component VI, and the second digital-to-analog converter provides the quadrature direct current component VQ. Certainly, alternatively, the first digital-to-analog converter provides the quadrature direct current component VQ, and the second digital-to-analog converter provides the quadrature direct current component VI. The VI is used to adjust a quadrature direct current component I in a transmit link, and the VQ is used to adjust a quadrature direct current component Q in a transmit link.

The local oscillator is connected to the mixer, and the local oscillator is configured to provide the mixer with a local oscillator signal. Quadrature processing is performed on the local oscillator signal in the mixer, to obtain two local oscillator signals that are of 0° and 90°. In the mixer, the two local oscillator signals may be mixed with the quadrature direct current components I and Q in the transmit link.

The mixer is connected to the signal output line, and the mixer is configured to output a local oscillator feedthrough signal to the signal output line. In this embodiment of the present disclosure, in a transmit timeslot, the mixer outputs a main signal, and the main signal carries the local oscillator feedthrough signal. In a receive timeslot, there is no main signal in the transmit link, and the mixer outputs only the local oscillator feedthrough signal.

One end of the detector tube is connected to the signal splitter, and the other end of the detector tube is connected to the microprocessor control unit. The signal splitter is configured to obtain the local oscillator feedthrough signal by means of splitting, and the detector tube is configured to detect the local oscillator feedthrough signal.

The microprocessor control unit is configured to: when a detection value that is of the local oscillator feedthrough signal and that is detected by the detector tube exceeds a preset local oscillator feedthrough target value, control the first digital-to-analog converter and the second digital-to-analog converter to adjust output values of the VI and the VQ.

The local oscillator feedthrough target value is preset in the microprocessor control unit. When a local oscillator feedthrough amount is quite small, adjustment does not need to be performed, but when the local oscillator feedthrough amount is greater than the target value, the quadrature direct current components I and Q can be adjusted by adjusting the VI and the VQ, thereby reducing local oscillator feedthrough.

In this embodiment of the present disclosure, a closed loop is established between the microprocessor control unit and the signal output line by using the signal splitter and the detector tube, so that direct current components of quadrature signals I/Q at an input end of the mixer can be adjusted in real time, thereby reducing local oscillator feedthrough.

In the embodiment shown in FIG. 1, the signal splitter may be disposed at the location 1, the location 2, or the location 3. With reference to the accompanying drawings, the following describes cases in which the signal splitter is separately disposed at the location 1, the location 2, and the location 3.

Figure 2:
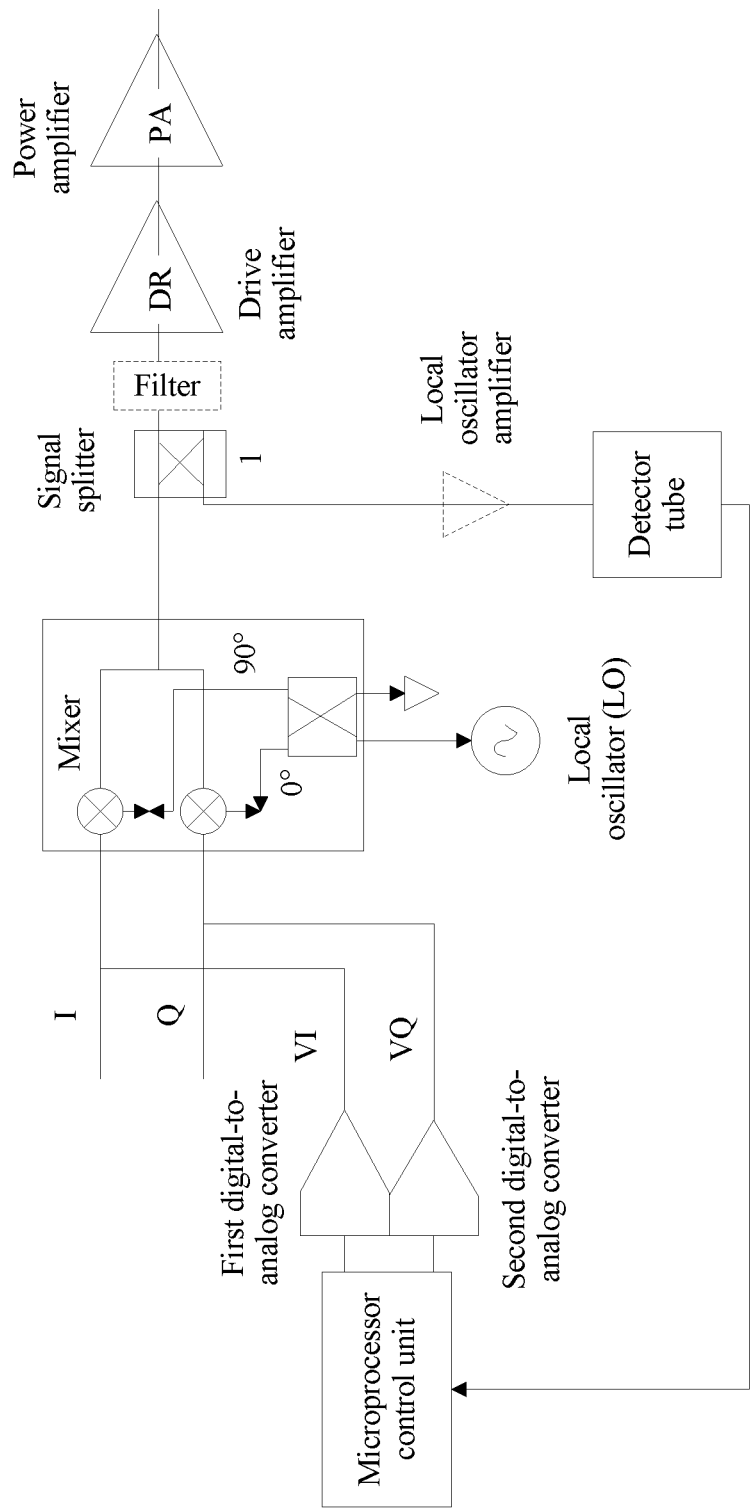
FIG. 2 is another schematic diagram of an embodiment of a local oscillator feedthrough signal correction apparatus according to the embodiments of the present disclosure.

As shown in FIG. 2, when the signal splitter is disposed at the location 1 shown in FIG. 1, basic components of a local oscillator feedthrough signal correction apparatus provided in an embodiment of the present disclosure are almost the same as those shown in FIG. 1, but a filter may be further disposed between the signal splitter and the drive amplifier. After the mixer outputs a local oscillator feedthrough signal, the signal splitter may split the local oscillator feedthrough signal from a main signal. A local oscillator feedthrough signal that is not split may be filtered out by the filter, and this can further remove the local oscillator feedthrough signal from the main signal.

Figure 3:
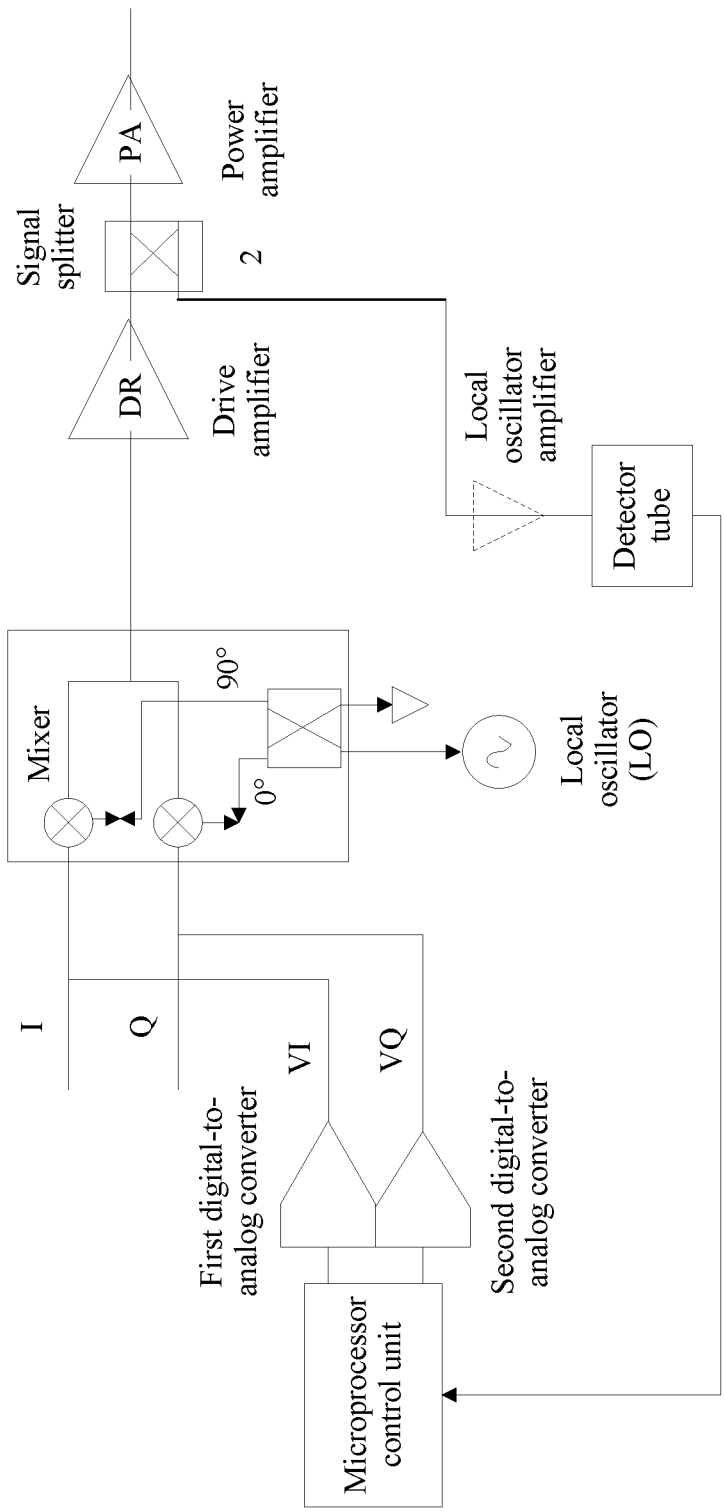
FIG. 3 is another schematic diagram of an embodiment of a local oscillator feedthrough signal correction apparatus according to the embodiments of the present disclosure.

As shown in FIG. 3, when the signal splitter is disposed at the location 2 shown in FIG. 1, basic components of a local oscillator feedthrough signal correction apparatus provided in an embodiment of the present disclosure are almost the same as those shown in FIG. 1, but a filter does not need to be disposed in the structure shown in FIG. 2, so that a quantity of components can be reduced.

The structures shown in FIG. 2 and FIG. 3 are both applicable to a system in which a power amplifier is in a disabled state in a receive timeslot.

Figure 4:
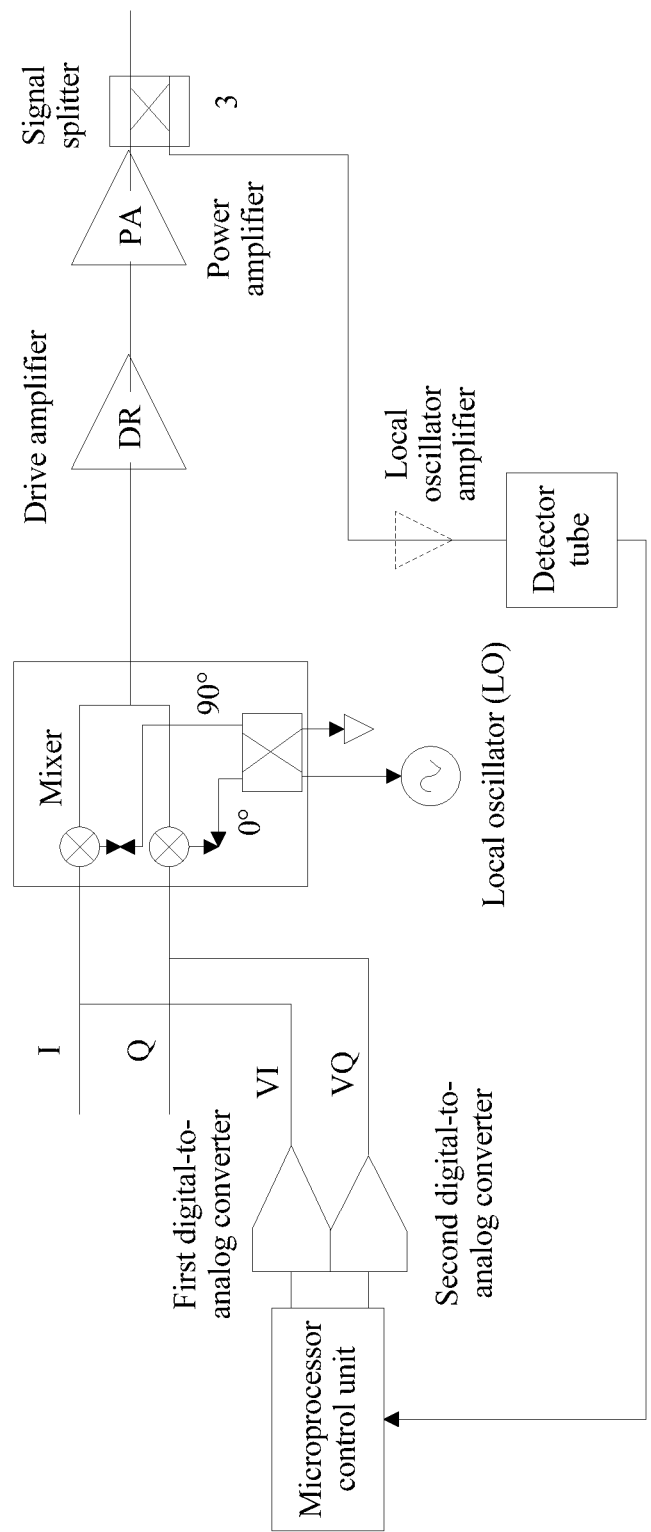
FIG. 4 is another schematic diagram of an embodiment of a local oscillator feedthrough signal correction apparatus according to the embodiments of the present disclosure.

As shown in FIG. 4, when the signal splitter is disposed at the location 3 shown in FIG. 1, basic components of a local oscillator feedthrough signal correction apparatus provided in an embodiment of the present disclosure are almost the same as those shown in FIG. 1, but such a structure is more applicable to a system in which a power amplifier is in an enabled state in a receive timeslot.

The structures shown in FIG. 2 and FIG. 3 are both applicable to a time division duplex (TDD) system.

Actually, the structures shown in FIG. 2 and FIG. 3 are applicable to the TDD system in which local oscillator feedthrough signal correction is performed in a receive timeslot. In the receive timeslot, a PA is disabled, and a transmit signal is disabled. In this case, the detector tube detects only a local oscillator feedthrough signal, so that impact of a main signal is avoided. For example, according to an actual situation, the local oscillator amplifier may be optionally provided, so that correction efficiency is higher, and a correction result is better. An actual correction effect may be: a detector tube lower limit−an amplifier gain+a coupler coupling degree. For example, if the detector tube lower limit is −30 dBm, the amplifier gain is 30 dB, and the coupling degree is 10 dB, the correction effect is: −30−30+10=−50 dBm, and the detector tube can provide a dynamic detection range of more than 50 dB in combination with the local oscillator amplifier. In actual application, a system requirement is met by setting the three parameters. The amplifier gain is a total gain of amplifiers through which the local oscillator feedthrough signal passes.

In this case, optionally, when the signal splitter is disposed on the first connection cable or the second connection cable, that is, the location 1 or the location 2 shown in FIG. 1 to FIG. 3, the microprocessor control unit is configured to: when determining that a current timeslot of a transmit link is a receive timeslot, read the detection value of the local oscillator feedthrough signal from the detector tube. In this way, a better correction effect can be ensured.

With reference to the description in FIG. 1 to FIG. 4, referring to FIG. 5, a local oscillator feedthrough signal correction method provided in the embodiments of the present disclosure includes the following steps.

101. A microprocessor control unit reads, from a detector tube, a detection value that is of a local oscillator feedthrough signal and that is detected by the detector tube, where the microprocessor control unit is applied to a communication transmission system, and the communication transmission system further includes a first digital-to-analog converter, a second digital-to-analog converter, a mixer, a local oscillator, a signal output line, a signal splitter, and the detector tube, where the signal splitter is disposed in the signal output line, the microprocessor control unit is connected to the first digital-to-analog converter and the second digital-to-analog converter, the first digital-to-analog converter and the second digital-to-analog converter are separately connected to the mixer, the local oscillator is connected to the mixer, the mixer is connected to the signal output line, one end of the detector tube is connected to the signal splitter, and the other end of the detector tube is connected to the microprocessor control unit.

102. The microprocessor control unit compares the detection value with a preset local oscillator feedthrough target value.

103. When the detection value is greater than the target value, the microprocessor control unit controls and adjusts quadrature direct current components VI and VQ that are output by the first digital-to-analog converter and the second digital-to-analog converter to the mixer and that are used for local oscillator feedthrough signal correction.

In the prior art, it is difficult to filter out a local oscillator feedthrough signal. By contrast, according to the local oscillator feedthrough signal correction method provided in this embodiment of the present disclosure, a closed loop is established between the microprocessor control unit and the signal output line by using the signal splitter and the detector tube, so that direct current components of quadrature signals I/Q at an input end of the mixer can be adjusted in real time, thereby reducing local oscillator feedthrough.

Optionally, based on the foregoing embodiment corresponding to FIG. 5, in an optional embodiment of the local oscillator feedthrough signal correction method provided in this embodiment of the present disclosure, the signal output line includes a drive amplifier, a power amplifier, a first connection cable, and a second connection cable. The first connection cable is configured to connect the drive amplifier and the mixer, the second connection cable is configured to connect the drive amplifier and the power amplifier, and the signal splitter is disposed on the first connection cable or the second connection cable.

That a microprocessor control unit reads, from the detector tube, a detection value that is of a local oscillator feedthrough signal and that is detected by the detector tube may specifically include:

before reading, from the detector tube, the detection value that is of the local oscillator feedthrough signal and that is detected by the detector tube, the microprocessor control unit determines whether a current timeslot of a transmit link is a receive timeslot; and when the current timeslot is the receive timeslot, the microprocessor control unit reads, from the detector tube, the detection value that is of the local oscillator feedthrough signal and that is detected by the detector tube.

Figure 6:
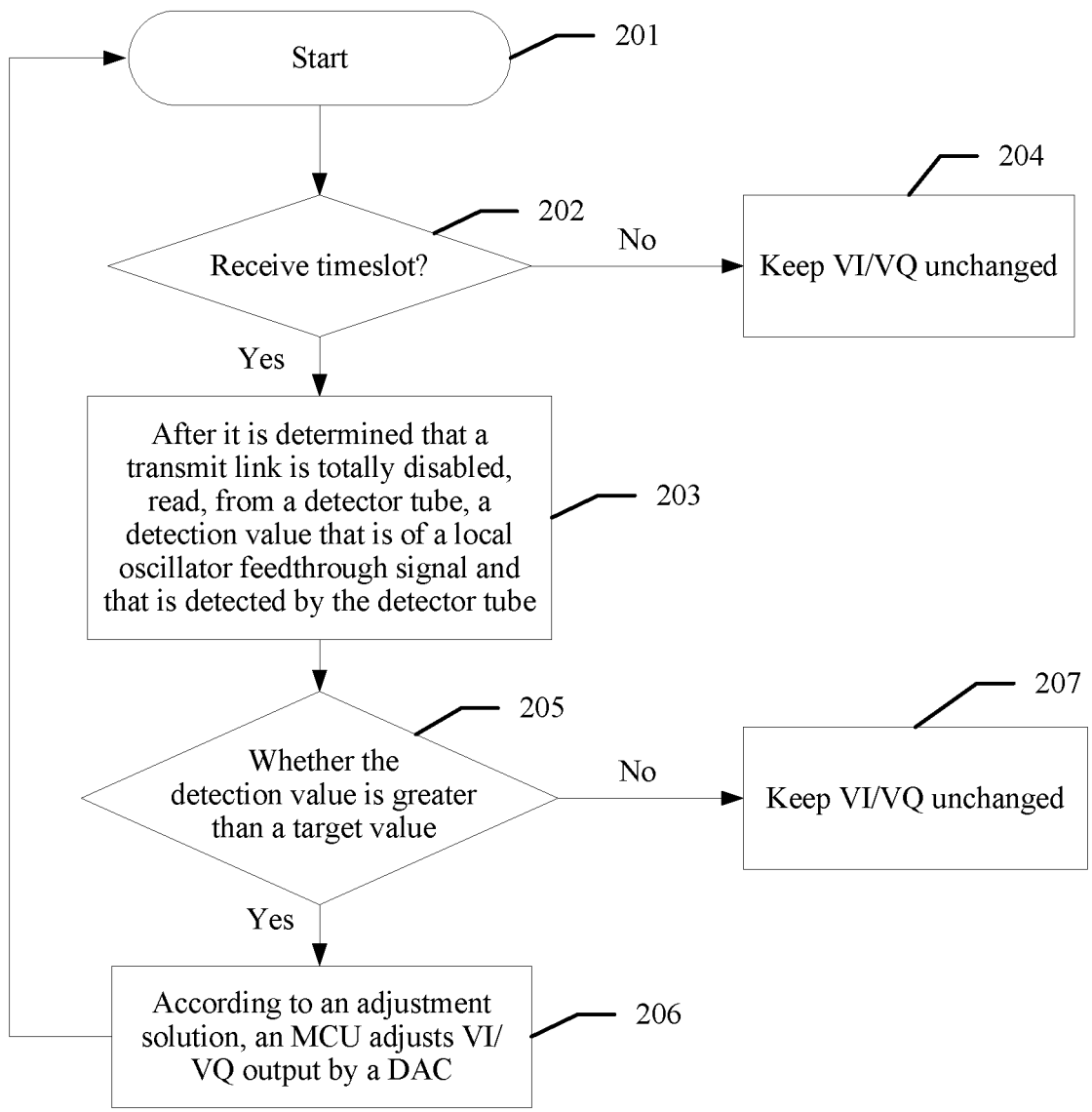
FIG. 6 is another schematic diagram of an embodiment of a local oscillator feedthrough signal correction method according to the embodiments of the present disclosure.

For ease of understanding, referring to FIG. 6, the following further describes a local oscillator feedthrough signal correction method in an embodiment of the present disclosure.

201. A microprocessor control unit starts to execute a timeslot determining program.

202. The microprocessor control unit determines whether a transmit link is currently in a receive timeslot, and if the transmit link is currently in a receive timeslot, performs step 20, or if the transmit link is not currently in a receive timeslot, performs step 204.

203. After determining that the transmit link is totally disabled, the microprocessor control unit reads, from a detector tube, a detection value that is of a local oscillator feedthrough signal and that is detected by the detector tube.

Whether the transmit link is totally disabled may be determined according to whether a PA is totally disabled.

204. The microprocessor control unit keeps values of VI and VQ unchanged.

205. The microprocessor control unit determines whether the read detection value is greater than a preset target value, and if the read detection value is greater than the preset target value, performs step 206, or if the read detection value is not greater than the preset target value, performs step 207.

206. The microprocessor control unit adjusts output values of VI and VQ.

In a specific adjustment solution, adjustment may be performed one step by one step; or an adjustment amount may be calculated, and adjustment is performed at one time, provided that an adjusted detection value of the local oscillator feedthrough signal is less than the target value.

207. The microprocessor control unit keeps values of VI and VQ unchanged.

In this embodiment of the present disclosure, the local oscillator feedthrough signal is corrected in the receive timeslot, so that a signal splitter detects only the local oscillator feedthrough signal. In this way, a detection result is accurate, a correction effect is favorable, and a system service is not affected.

Figure 7:
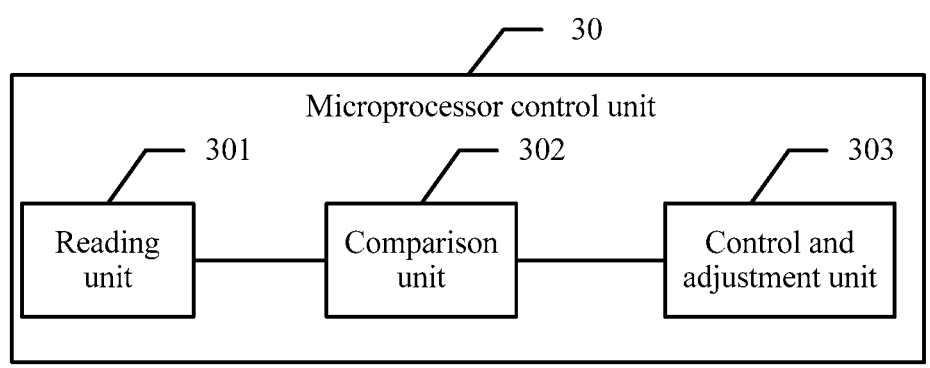
FIG. 7 is a schematic diagram of an embodiment of a microprocessor control unit according to the embodiments of the present disclosure.

Referring to FIG. 7, a microprocessor control unit 30 provided in an embodiment of the present disclosure is applied to a communication transmission system, and the communication transmission system further includes a first digital-to-analog converter, a second digital-to-analog converter, a mixer, a local oscillator, a signal output line, a signal splitter, and a detector tube. The signal splitter is disposed in the signal output line, and the microprocessor control unit is connected to the first digital-to-analog converter and the second digital-to-analog converter. The first digital-to-analog converter and the second digital-to-analog converter are separately connected to the mixer, the local oscillator is connected to the mixer, and the mixer is connected to the signal output line. One end of the detector tube is connected to the signal splitter, and the other end of the detector tube is connected to the microprocessor control unit. The microprocessor control unit includes:

a reading unit 301, configured to read, from the detector tube, a detection value that is of a local oscillator feedthrough signal and that is detected by the detector tube;

a comparison unit 302, configured to compare the detection value read by the reading unit 301 with a preset local oscillator feedthrough target value; and a control and adjustment unit 303, configured to: when the comparison unit 302 learns that the detection value is greater than the target value, control and adjust quadrature direct current components VI and VQ that are output by the first digital-to-analog converter and the second digital-to-analog converter to the mixer and that are used for local oscillator feedthrough signal correction.

In the prior art, it is difficult to filter out a local oscillator feedthrough signal. By contrast, according to the microprocessor control unit provided in this embodiment of the present disclosure, direct current components of quadrature signals I/Q at an input end of the mixer can be adjusted in real time, thereby reducing local oscillator feedthrough.

Optionally, based on the foregoing embodiment corresponding to FIG. 7, in an optional embodiment of the microprocessor control unit provided in this embodiment of the present disclosure, the signal output line includes a drive amplifier, a power amplifier, a first connection cable, and a second connection cable. The first connection cable is configured to connect the drive amplifier and the mixer, the second connection cable is configured to connect the drive amplifier and the power amplifier, and the signal splitter is disposed on the first connection cable or the second connection cable.

The reading unit 301 is specifically configured to:

before reading, from the detector tube, the detection value that is of the local oscillator feedthrough signal and that is detected by the detector tube, determine whether a current timeslot of a transmit link is a receive timeslot; and when the current timeslot is the receive timeslot, read, from the detector tube, the detection value that is of the local oscillator feedthrough signal and that is detected by the detector tube.

The MCU provided in this embodiment of the present disclosure corrects the local oscillator feedthrough signal in the receive timeslot, so that the signal splitter detects only the local oscillator feedthrough signal. In this way, a detection result is accurate, a correction effect is favorable, and a system service is not affected.

The communications transmission system in this embodiment of the present disclosure may be understood with reference to the related description in FIG. 1 to FIG. 4.

A person of ordinary skill in the art may understand that all or a part of the steps of the methods in the embodiments may be implemented by a program instructing relevant hardware. The program may be stored in a computer readable storage medium. The storage medium may include: a ROM, a RAM, a magnetic disk, or an optical disc.

The local oscillator feedthrough signal correction apparatus and method, and the microprocessor control unit are described in detail above in the embodiments of the present disclosure. Specific examples are used in this specification to describe the principle and implementations of the present disclosure. The descriptions of the foregoing embodiments are merely intended to help understand the method and idea of the present disclosure. In addition, with respect to the implementations and the application scope, modifications may be made by a person of ordinary skill in the art according to the idea of the present disclosure. Therefore, this specification shall not be construed as a limitation on the present disclosure.

What is claimed is:

1. A local oscillator feedthrough signal correction apparatus, comprising:
   a microprocessor control unit connected to a first digital-to-analog converter and a second digital-to-analog converter, wherein the first digital-to-analog converter and the second digital-to-analog converter are separately connected to a mixer and are configured to provide the mixer with quadrature direct current components VI and VQ used for local oscillator feedthrough signal correction;
   a local oscillator connected to the mixer and configured to provide the mixer with a local oscillator signal, and wherein the mixer is connected to a signal output line and configured to output a local oscillator feedthrough signal to the signal output line;
   a detector tube having one end connected to a signal splitter and another end connected to the microprocessor control unit, wherein the signal splitter is disposed in the signal output line and configured to obtain the local oscillator feedthrough signal by means of splitting, and the detector tube is configured to detect the local oscillator feedthrough signal; and
   wherein the microprocessor control unit is configured to:
   when a detection value of the local oscillator feedthrough signal that is detected by the detector tube exceeds a preset local oscillator feedthrough target value, control the first digital-to-analog converter and the second digital-to-analog converter to adjust output values of the VI and the VQ.

2. The apparatus according to claim 1, further comprising:
   a local oscillator amplifier having one end connected to the detector tube and another end connected to the signal splitter, wherein the local oscillator amplifier is configured to amplify the local oscillator feedthrough signal obtained by the signal splitter by means of splitting.

3. The apparatus according to claim 1, wherein:
   the signal output line comprises a drive amplifier, a power amplifier, a first connection cable, a second connection cable, and a third connection cable, wherein the first connection cable is configured to connect the drive amplifier and the mixer, the second connection cable is configured to connect the drive amplifier and the power amplifier, and the third connection cable is configured to connect the power amplifier and an output component; and
   the signal splitter is disposed on the first connection cable, the second connection cable, or the third connection cable.

4. The apparatus according to claim 3, wherein when the signal splitter is disposed on the first connection cable, the signal output line further comprises a filter disposed between the signal splitter and the drive amplifier.

5. The apparatus according to claim 3, wherein when the signal splitter is disposed on the third connection cable, the power amplifier is in an enabled state in a receive timeslot.

6. The apparatus according to claim 3, wherein when the signal splitter is disposed on the first connection cable or the second connection cable, the microprocessor control unit is configured to:
   when determining that a current timeslot of a transmit link is a receive timeslot, read the detection value of the local oscillator feedthrough signal from the detector tube.

* * * * *